United States Patent
Schulze et al.

(10) Patent No.: US 12,107,141 B2
(45) Date of Patent: Oct. 1, 2024

(54) SEMICONDUCTOR DEVICE HAVING A SILICON CARBIDE DRIFT ZONE OVER A SILICON CARBIDE FIELD STOP ZONE

(71) Applicant: Infineon Technologies AG, Neubiberg (DE)

(72) Inventors: Hans-Joachim Schulze, Taufkirchen (DE); Jens Peter Konrath, Villach (AT); Andre Rainer Stegner, Unterhaching (DE); Helmut Strack, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/691,251

(22) Filed: Mar. 10, 2022

(65) Prior Publication Data

US 2022/0199800 A1 Jun. 23, 2022

Related U.S. Application Data

(63) Continuation of application No. 16/925,523, filed on Jul. 10, 2020, now Pat. No. 11,302,795.

(30) Foreign Application Priority Data

Jul. 11, 2019 (DE) .......................... 102019118803.2

(51) Int. Cl.
*H01L 29/66* (2006.01)
*H01L 21/02* (2006.01)
(Continued)

(52) U.S. Cl.
CPC .. *H01L 29/66068* (2013.01); *H01L 21/02529* (2013.01); *H01L 21/0465* (2013.01);
(Continued)

(58) Field of Classification Search
CPC ........... H01L 21/02529; H01L 21/0445; H01L 21/0465; H01L 21/266; H01L 29/1095;
(Continued)

(56) References Cited

U.S. PATENT DOCUMENTS

| | | |
|---|---|---|
| 2010/0173475 A1 | 7/2010 | Tsuchida et al. |
| 2015/0115283 A1 | 4/2015 | Domeij |

(Continued)

FOREIGN PATENT DOCUMENTS

| | | | |
|---|---|---|---|
| DE | 102015111213 A1 | | 1/2017 |
| JP | 2011109018 | * | 6/2011 |
| JP | 2018166196 A | | 10/2018 |

OTHER PUBLICATIONS

Sharma, Rupendra Kumar, et al., "The Effect of Light Ion Irradiation on 4H-SiC MPS Power Diode Characteristics: Experiment and Simulation", IEEE Transactions on Nuclear Science, vol. 62, No. 2, Apr. 2015, 534-541.

*Primary Examiner* — Fazli Erdem
(74) *Attorney, Agent, or Firm* — Murphy, Bilak & Homiller, PLLC

(57) ABSTRACT

A semiconductor device includes a silicon carbide (SiC) drift zone over a SiC field stop zone and/or a SiC semiconductor substrate. A concentration of $Z_{1/2}$ defects in the SiC drift zone is at least one order of magnitude smaller than in the SiC field stop zone and/or the SiC semiconductor substrate. Separately or in combination, a concentration of $Z_{1/2}$ defects in a part of the SiC drift zone is at least one order of magnitude smaller than in another part of the drift zone.

21 Claims, 4 Drawing Sheets

(51) Int. Cl.
*H01L 21/04* (2006.01)
*H01L 29/10* (2006.01)
*H01L 29/16* (2006.01)
*H01L 29/78* (2006.01)

(52) U.S. Cl.
CPC ...... *H01L 29/1095* (2013.01); *H01L 29/1608* (2013.01); *H01L 29/7813* (2013.01)

(58) Field of Classification Search
CPC ........... H01L 29/1608; H01L 29/66068; H01L 29/7813
USPC .......................................................... 257/77
See application file for complete search history.

(56) References Cited

U.S. PATENT DOCUMENTS

| | | | |
|---|---|---|---|
| 2015/0270351 A1 | 9/2015 | Nishio et al. | |
| 2016/0005605 A1* | 1/2016 | Nishio | H01L 29/1054 257/77 |
| 2016/0218176 A1* | 7/2016 | Hiyoshi | H01L 29/0649 |
| 2016/0247894 A1 | 8/2016 | Hamada et al. | |
| 2016/0276497 A1 | 9/2016 | Mizukami | |
| 2016/0336390 A1 | 11/2016 | Hamada et al. | |
| 2016/0365250 A1* | 12/2016 | Matsui | H01L 21/2253 |
| 2017/0012102 A1 | 1/2017 | Konrath et al. | |
| 2018/0233564 A1 | 8/2018 | Kumada et al. | |
| 2018/0269313 A1* | 9/2018 | Bina | H01L 29/423 |
| 2019/0157395 A1 | 5/2019 | Schulze et al. | |
| 2020/0194562 A1 | 6/2020 | Yoshimura et al. | |
| 2020/0203513 A1* | 6/2020 | Konrath | H01L 29/0696 |
| 2022/0223583 A1* | 7/2022 | Hamada | H01L 29/7397 |

* cited by examiner

SEMICONDUCTOR DEVICE HAVING A SILICON CARBIDE DRIFT ZONE OVER A SILICON CARBIDE FIELD STOP ZONE

TECHNICAL FIELD

The present disclosure relates to methods of manufacturing a semiconductor device, in particular, to methods of manufacturing a semiconductor device in a silicon carbide semiconductor body.

BACKGROUND

Power semiconductor devices are typically used as switches and rectifiers in electric circuits for transforming electrical energy, for example, in DC/AC converters, AC/AC converters or AC/DC converters, and in electric circuits that drive heavy inductive loads, e.g., in motor driver circuits. The dielectric breakdown field strength of silicon carbide (SiC) is high compared to silicon. Therefore, SiC devices may be thinner than equivalent silicon devices with the same nominal blocking voltage. On the other hand, electrical parameters of silicon carbide devices tend to deteriorate at a higher rate than it is typically the case for equivalent silicon devices.

There is a need for improving long-term stability of silicon carbide device parameters.

SUMMARY

An example of the present disclosure relates to a method of manufacturing a semiconductor device. The method includes providing a silicon carbide, SiC, semiconductor body. The method further includes introducing ions into the SiC semiconductor body through a first surface of the SiC semiconductor body by at least one ion implantation process. Thereafter, the method further includes forming a SiC device layer on the first surface of the SiC semiconductor body, and forming semiconductor device elements in or over the SiC device layer.

A further example of the present disclosure relates to another method of manufacturing a semiconductor device. The method includes providing a silicon carbide, SiC, semiconductor body. The method further includes forming a SiC device layer over the SiC semiconductor body. The method further includes introducing ions into the SiC device layer through a first surface of the SiC device layer by at least one ion implantation process. A predominant part of a vertical extent of a drift zone in the SiC device layer is arranged between an end-of-range peak of the ions and the first surface of the SiC device layer. Thereafter, the method further includes forming semiconductor device elements in or over the SiC device layer.

A further example of the present disclosure relates to a semiconductor device. The semiconductor device includes a SiC drift zone over a SiC field stop zone and/or a SiC semiconductor substrate. A concentration of $Z_{1/2}$ defects in the SiC drift zone is at least a factor 3 or at least one order of magnitude or at least 2 orders of magnitude or even at least 3 orders of magnitude smaller than in the SiC field stop zone and/or the SiC semiconductor substrate.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of a method of manufacturing a silicon carbide device and together with the description serve to explain principles of the examples. Further examples are described in the following detailed description and the claims.

DETAILED DESCRIPTION

Figure 1A:
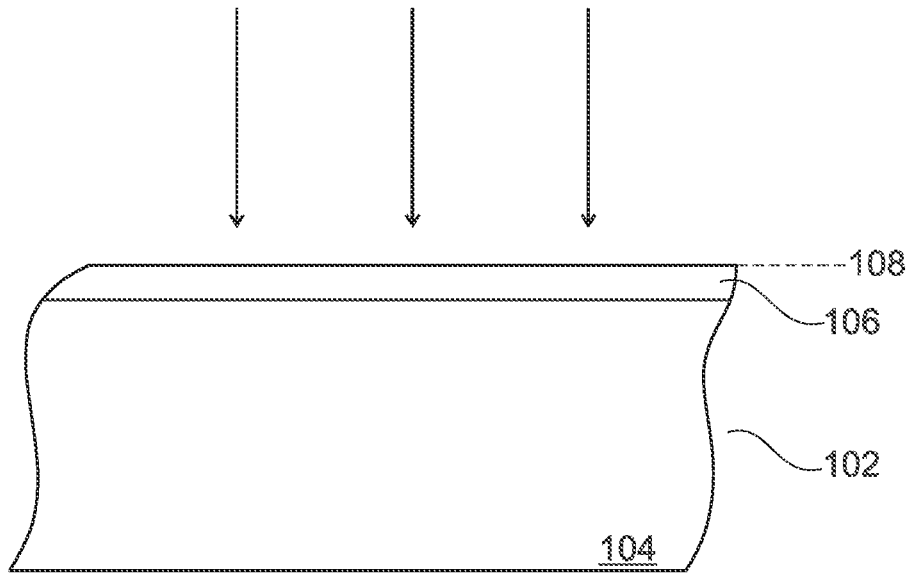
FIGS. 1A to 1E show schematic cross-sectional views for illustrating a method of manufacturing a SiC semiconductor device including introducing ions into a SiC semiconductor body before forming a SiC device layer on the SiC semiconductor body.

In the following detailed description, reference is made to the accompanying drawings, which form a part hereof and in which are shown by way of illustrations specific examples in which a method of manufacturing a silicon carbide device may be practiced. It is to be understood that other examples may be utilized and structural or logical changes may be made without departing from the scope of the present disclosure. For example, features illustrated or described for one example can be used on or in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

Ranges given for physical dimensions include the boundary values. For example, a range for a parameter y from a to b reads as a≤y≤b. The same holds for ranges with one boundary value like "at most" and "at least".

Main constituents of a layer or a structure from a chemical compound or alloy are such elements which atoms form the chemical compound or alloy. For example, silicon (Si) and carbon (C) are the main constituents of a silicon carbide (SiC) layer.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

An example of a method of manufacturing a semiconductor device may include providing a silicon carbide, SiC, semiconductor body. The method may further include introducing ions into the SiC semiconductor body through a first surface of the SiC semiconductor body by at least one ion implantation process. Thereafter, the method may further include forming a SiC device layer on the first surface of the SiC semiconductor body, and forming semiconductor device elements in or over the SiC device layer.

The silicon carbide semiconductor body may be a crystalline semiconductor substrate. For example, the silicon carbide crystal may have a hexagonal polytype, e.g., 4H or 6H. The silicon carbide semiconductor body may be homogeneously doped or may include differently doped SiC layer portions. The silicon carbide semiconductor body may include one or more layers from another material with a melting point close to or higher than crystalline silicon carbide. For example, the layers from another material may be embedded in the crystalline silicon carbide substrate.

The silicon carbide semiconductor body may have two essentially parallel main surfaces of the same shape and size and a lateral surface area connecting the edges of the two main surfaces. For example, the silicon carbide semiconductor body may be a rectangular prism with or without rounded edges or a right cylinder or a slightly oblique cylinder (e.g. where the sides lean with an angle of at most 8° or at most 5° or at most 3°) with or without one or more flats or notches along the outer circumference.

The silicon carbide semiconductor body may laterally extend in a plane spanned by lateral directions (also called "horizontal directions").

Perpendicular to the lateral directions, in a vertical direction, the silicon carbide semiconductor body may have a thickness that is small compared to the respective extension of the silicon carbide semiconductor body in the lateral directions. The lateral directions may run parallel to the main surfaces or may enclose an angle of at most 10° or at most 8° or at most 5° with at least one of the main surfaces.

After introducing the ions into the SiC semiconductor body, the SiC device layer may be formed on the first surface of the SiC semiconductor body by at least one layer deposition process, e.g. epitaxial layer deposition process. For example, chemical vapor deposition (CVD) techniques may be used for forming the SiC device layer. A doping concentration profile and/or thickness of the SiC device layer may be chosen in consideration of target device parameters, e.g. voltage blocking capability and/or area-specific on-state resistance. For example, a first part of the SiC device layer may be a drift zone. For example, a second part of the SiC device layer may be a field stop zone. The field stop zone may be arranged between the drift zone and a rear side contact. For example, a doping concentration in the drift zone may be larger, e.g. one or two orders of magnitude larger, than a doping concentration in the drift zone.

Forming the semiconductor device elements in or over the SiC device layer may include one or more features of forming semiconducting regions, e.g. p- and/or n-doped regions, insulating layers, e.g. gate and/or field dielectric(s) and/or interlayer dielectric(s), conducting layers, e.g. metal layer(s) for electric contacts and/or wirings, protection and/or passivation layer(s), e.g. imide. The semiconductor regions, e.g. a drain region, a source region, a body region, a body contact region, a current spread region, a shielding region, an anode region, a cathode region, may be formed by ion implantation and/or diffusion from a diffusion source, for example. A planar gate structure including a gate dielectric and a gate electrode or a trench gate structure including a gate dielectric and a gate electrode in a trench may be formed by thermal oxidation and/or layer deposition of the gate dielectric and layer deposition of a highly doped semiconductor, for example polycrystalline silicon and/or metal layer(s). Thus, the semiconductor device elements may be formed in the SiC device layer after introducing the ions into the SiC semiconductor body.

In at least one operational mode of the semiconductor device, e.g., a reverse conducting mode, a bipolar current consisting of holes and electrons flows through the silicon carbide semiconductor body. The bipolar current passes at least a pn junction of the semiconductor device. In particular in the vicinity of the pn junctions and further, if applicable, in the vicinity of unipolar junctions, holes and electrons may recombine at a more than insignificant rate. The recombination may set free energy (e.g. thermal energy) and/or momentum that may promote bipolar degradation. Bipolar degradation denotes the growth of preexisting crystallographic defects. For example, BPD (basal plane dislocations) between neighboring lattice planes may transform into SSFs (Shockley stacking faults) which grow along the lattice planes in a direction that is predominately transversal to a vertical load current flow through the silicon carbide body. The lattice defects may more and more impede the vertical load current flow through the silicon carbide body, e.g. deteriorate device reliability. The at least one ion implantation process may be adapted for generating recombination sites, e.g. defects introduced by the at least one ion implantation process, at a position in the semiconductor device where electron and hole recombination is less detrimental to device reliability than other positions. For example, the recombination sites may be arranged between a rear side contact, e.g. a cathode contact of a power semiconductor diode or a drain contact of a power FET or a collector contact of an IGBT. For example, end-of-range depths of the ions implanted into the SiC semiconductor body may range from 200 nm to 10 μm or from 300 nm to 60 μm, for example. In view of the temperature stability of the recombination sites in SiC, e.g. defects introduced by the at least one ion implantation process, the recombination sites can withstand high temperatures that may occur when e.g. forming the semiconductor device elements in or over the SiC semiconductor body. Since recombination site generation precedes the formation of semiconductor device elements in or over the SiC semiconductor body, e.g. gate dielectric formation, reliability of the semiconductor device elements in or over the SiC semiconductor body may be improved because the ion implantation process associated with the recombination sites cannot deteriorate reliability of the semiconductor device elements, for example.

For example, providing the SiC semiconductor body may include providing a SiC semiconductor substrate. The SiC semiconductor substrate may be a 4H—SiC semiconductor substrate. The SiC semiconductor substrate or a predominant part thereof may be reused by a splitting process after forming the SiC device layer over the SiC semiconductor substrate, for example.

For example, providing the SiC semiconductor body may include forming a SiC buffer layer on the SiC semiconductor substrate. The buffer layer may be used for generating recombination sites therein, e.g. defects generated by introducing the ions into the buffer layer of the semiconductor body. After generating the recombination sites in the buffer layer, the SiC device layer may be formed. For example, a layer deposition process may be interrupted for introducing the ions in the buffer layer. A first part of the layer deposition process, e.g. before introducing the ions into the semiconductor body, may be used for forming the buffer layer. The buffer layer may be used as a field stop zone by introducing dopants therein, for example. A second part of the layer deposition process, e.g. after introducing the ions into the semiconductor body, may be used for forming a drift zone, for example.

For example, a thickness of the SiC buffer layer may range from 0.5 μm to 30 μm or from 1 to 10 μm. For example, a cleaning process, e.g. a hydrogen etch process, before layer deposition of the SiC layer and a number of defects generated per implanted ion and irradiated depth range, may be taken into account when setting the original thickness of the SiC buffer layer, for example. This may allow for accounting for a reduction of thickness of the buffer layer by the cleaning process, for example.

For example, a doping concentration averaged along a vertical extent of the SiC device layer may be smaller than a doping concentration averaged along a vertical extent of the SiC buffer layer. The SiC buffer layer may include or correspond to a field stop zone having a larger doping concentration than a drift zone formed in the SiC device layer, for example. For example, the doping concentration averaged along a vertical extent of the SiC buffer layer may range from $5 \times 10^{16}$ cm$^{-3}$ to $1 \times 10^{19}$ cm$^{-3}$, or from $10^{17}$ cm$^{-3}$ to $5 \times 10^{18}$ cm$^{-3}$, for example.

For example, a doping concentration along a predominant part of a vertical extent of the SiC buffer layer may gradually and/or continuously decrease along a direction from the semiconductor substrate to the SiC device layer. The predominant part may be a part of the vertical extent of the SiC device layer that is larger than 50%, e.g. half, of the vertical extent of the SiC buffer layer. A gradual and/or continuous decrease may be achieved by varying in-situ doping during layer deposition of the SiC buffer layer and/or one or a plurality of overlapping ion implantation profiles of dopants, for example. In some other embodiments, a doping concentration along a predominant part of a vertical extent of the SiC buffer layer may be constant along a direction from the semiconductor substrate to the SiC device layer.

For example, the method may further include forming an implantation mask over the first surface of the SiC semiconductor body, wherein the ions for generating the recombination sites are introduced through openings in the implantation mask. This may facilitate epitaxial layer growth of the SiC device layer in case of high ion implantation doses introduced into the SiC semiconductor body beforehand. A desired crystal quality of the SiC device layer may be ensured by a lateral epitaxial overgrowth process initiated at surface portions of the semiconductor body where the implantation mask hindered the ions from entering and damaging the lattice of the SiC semiconductor body, for example.

For example, a minimum lateral extent of at least some of the openings may range from 0.5 μm to 50 μm, or from 2 μm to 30 μm, and a lateral distance between neighboring two of the openings may range from 2 μm to 20 μm. This may allow for achieving a desired crystal quality of the SiC device layer by a lateral epitaxial overgrowth process initiated at surface portions of the semiconductor body where the implantation mask hindered the ions from entering and damaging the lattice of the SiC semiconductor body.

For example, the ions include at least one of protons, He-ions, Ar-ions, Si-ions, and C-ions.

For example, forming the semiconductor device elements includes at least one of forming device elements of a pn- or pin-diode, a bipolar junction transistor, a field effect transistor, an insulated gate bipolar transistor, and a thyristor.

Exemplary details described with reference to the method above, e.g. details on materials, functions, processes, arrangements or dimensions of structural elements such as semiconductor regions correspondingly apply to the method described further below and vice versa.

Another example of a method of manufacturing a semiconductor device may include providing a silicon carbide, SiC, semiconductor body. The method may further include forming a SiC device layer over the SiC semiconductor body. The method may further include introducing ions into the SiC device layer through a first surface of the SiC device layer by at least one ion implantation process. A predominant part of a vertical extent of a drift zone in the SiC device layer may be arranged between an end-of-range peak of the ions and the first surface of the SiC device layer. Thereafter, the method may further include forming semiconductor device elements in or over the SiC device layer. The predominant part may be a part of the vertical extent of the drift zone that is larger than 50% of the vertical extent of the drift zone. For example, the vertical extent of the drift zone may range from i) a pn junction between the drift zone and a body region of a FET or IGBT, or between the drift zone and an anode region of a diode to ii) a highly doped contact or drain region (or emitter region) at a rear side of an FET (or IGBT), or to a cathode contact at a rear side of a diode, for example. The drift zone may include a buffer layer or field stop zone, where at least a part or even most of the end-of-range region of the implantation may be implemented.

For example, a vertical distance between the end-of-range peak and the first surface may range from 5 μm to 100 μm, or from 6 μm to 60 μm, or from 8 μm to 20 μm, depending on the target breakdown voltage of the SiC device.

For example, a gate dielectric and a gate electrode may be formed after introducing the ions. Thus, a negative impact of the process of introducing the ions for generating recombination sites, e.g. defects, on the device reliability of a gate dielectric may be avoided or reduced, for example. This is because recombination site generation precedes the formation of reliability sensitive structural device elements, e.g. formation of a gate dielectric.

For example, the at least one ion implantation process may include a proton implantation having an ion implantation dose ranging from $5 \times 10^{10}$ cm$^{-2}$ to $5 \times 10^{13}$ cm$^{-2}$, or from $10^{11}$ cm$^{-2}$ to $5 \times 10^{12}$ cm$^{-2}$. The at least one ion implantation process may also include implantation of helium ions having an ion implantation dose ranging from $1 \times 10^{10}$ cm$^{-2}$ to $1 \times 10^{13}$ cm$^{-2}$, or from $2 \times 10^{10}$ cm$^{-2}$ to $1 \times 10^{12}$ cm$^{-2}$. The at least one ion implantation process may also include implantation of argon ions having an ion implantation dose ranging from $1 \times 10^9$ cm$^{-2}$ to $1 \times 10^{12}$ cm$^{-2}$, or from $2 \times 10^9$ cm$^{-2}$ to $1 \times 10^{11}$ cm$^{-2}$.

An example of a semiconductor device may include a SiC drift zone over a SiC field stop zone and/or a SiC semiconductor substrate. The semiconductor device may further include a concentration of $Z_{1/2}$ defects in the SiC drift zone that is at least one order of magnitude smaller than in the SiC field stop zone and/or the SiC semiconductor substrate. $Z_{1/2}$ defects may be observed in Deep Level Transient Spectroscopy (DLTS) spectra, for example. The $Z_{1/2}$ defects are most likely the negative-U acceptor state and double-acceptor state of the carbon vacancy based on support by experiments and theoretical calculations reported in the literature. The concentration of $Z_{1/2}$ defects in the SiC field stop zone and/or the SiC semiconductor substrate is larger than in the SiC drift zone due to defects generated by the at least one ion implantation process for generation of recombination sites at a position in the semiconductor device where electron and hole recombination is less detrimental to device reliability than at other positions.

For example, the SiC drift zone may be formed by 4H—SiC.

The examples described above may be examples of a power semiconductor device or examples for manufacturing a power semiconductor device, e.g. a silicon carbide power semiconductor device. The power semiconductor device or an electrical structure (e.g. transistor of the silicon carbide device) of the power semiconductor device may have a breakdown voltage or blocking voltage of more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

The examples and features described above and below may be combined.

Some of the above and below examples are described in connection with a silicon carbide substrate. Alternatively, a wide band gap semiconductor substrate, e.g. a wide band gap wafer, may be processed, e.g. comprising a wide band gap semiconductor material different from silicon carbide. The wide band gap semiconductor wafer may have a band gap larger than the band gap of silicon (1.1 eV). For example, the wide band gap semiconductor wafer may be a silicon carbide (SiC) wafer, or gallium arsenide (GaAs) wafer, or a gallium nitride (GaN) wafer.

More details and aspects are mentioned in connection with the examples described above or below. Processing the wide band gap semiconductor wafer may comprise one or more optional additional features corresponding to one or more aspects mentioned in connection with the proposed concept or one or more examples described above or below.

The aspects and features mentioned and described together with one or more of the previously described examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, e.g. by expressions like "thereafter", for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

FIGS. 1A to 1E illustrate a method for manufacturing a semiconductor device.

Referring to FIG. 1A, a silicon carbide, SiC, semiconductor body 102 is provided. The SiC semiconductor body 102 includes a SiC semiconductor substrate 104, e.g. a 4H—SiC semiconductor substrate. Optionally, a buffer layer 106 may be formed on the SiC semiconductor substrate 104. The method further includes introducing ions into the SiC semiconductor body through a first surface 108 of the SiC semiconductor body 102 by at least one ion implantation process. The end-of-range of the defect-generating ions may be in the buffer layer or in the SiC-substrate. The implantation into the substrate may be performed prior to or after the buffer implementation, for example.

Details described in the examples above, e.g. with respect to the SiC semiconductor body or the SiC semiconductor substrate or the optional buffer layer or the ions introduced into the SiC semiconductor body, likewise apply to the illustrated examples. The at least one ion implantation process is schematically illustrated in FIG. 1A by arrows indicating one exemplary direction, e.g. non-tilted ion implantation, of ions impinging on the first surface 108. Other implant directions, e.g. tilted implant directions, may also be used.

Figure 1B:
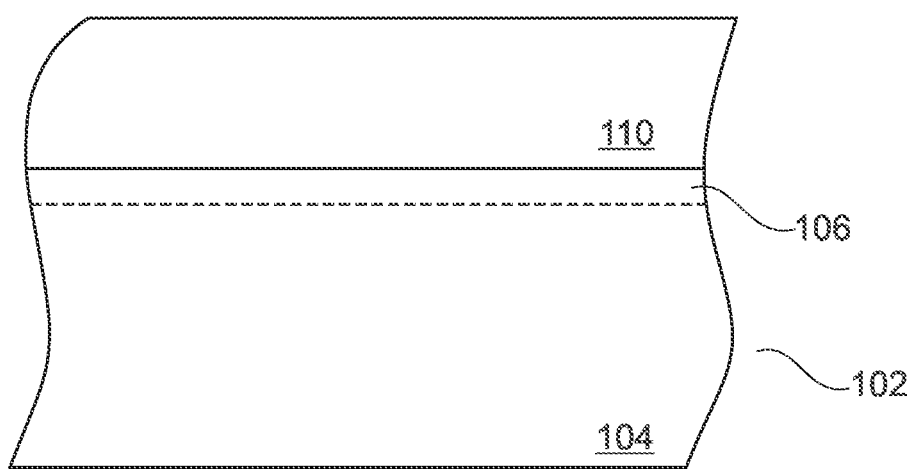

Referring to FIG. 1B, a SiC device layer 110 is formed on the first surface of the SiC semiconductor body 102. Details described in the example above, e.g. with respect to the SiC device layer, likewise apply to the illustrated examples.

Figure 1C:
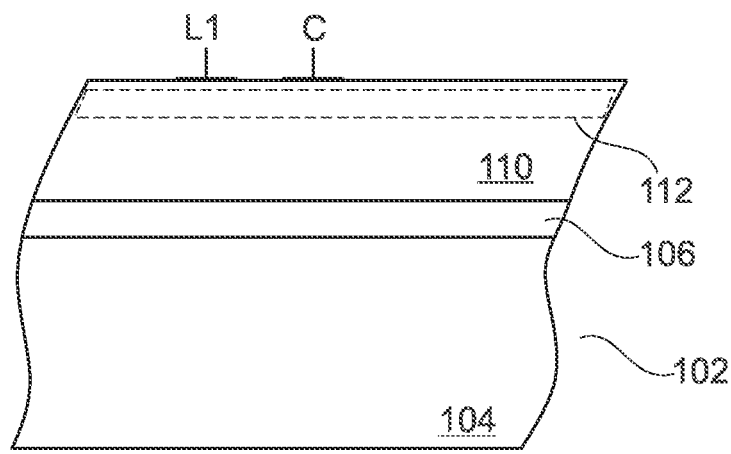
Figure 1D:
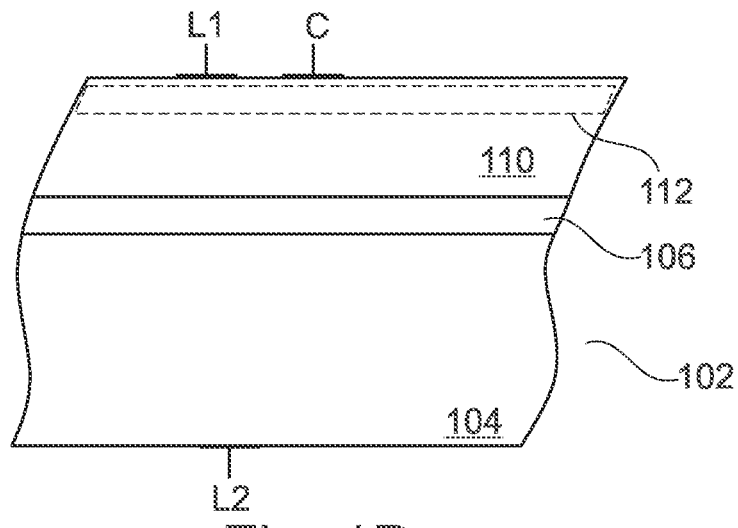
Figure 1E:
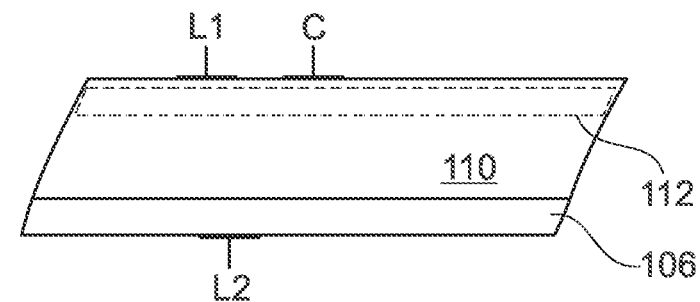

Referring to FIG. 1C, semiconductor device elements are formed in or over the SiC device layer 110. Details described in the examples above, e.g. with respect to the semiconductor device elements, likewise apply to the illustrated examples. In view of the various possibilities of semiconductor device elements formed in or over the SiC semiconductor device layer 110, the semiconductor device elements formed in the SiC device layer 110 are illustrated in a simplified manner by a dashed box 112 indicating a part of SiC device layer 110 that includes SiC semiconductor device elements therein, for example. As an example for semiconductor device elements formed over the SiC device layer 110, a first load electrode L1 and an optional control electrode C is schematically illustrated in FIG. 1D. The first load electrode L1, e.g. an anode electrode of a diode or thyristor or a source electrode of a FET or IGBT, may be part of a wiring area formed over the SiC device layer 110. The optional control electrode C, e.g. a gate electrode of a FET or an IGBT, may also be part of a wiring area formed over the SiC device layer 110. The wiring area may include one, two, three or even more wiring levels that may include patterned metal layers and interlayer dielectrics arranged between the patterned metal layers. Vias may electrically interconnect the different wiring levels, for example.

Referring to FIG. 1D, a second load electrode L2, e.g. a cathode electrode of a diode or a thyristor or a drain electrode of a FET or a collector electrode of an IGBT, may be formed on a second surface, e.g. at a rear side, of the semiconductor body 102. As is illustrated in the schematic view of FIG. 1E as an alternative to FIG. 1D, all or part of the SiC semiconductor substrate 104 may be removed. For example, all or part of the SiC semiconductor substrate 104 may be removed by mechanical grinding and/or etching. All or part of the SiC semiconductor substrate 104 may also be removed by a wafer split process. This may allow for reuse of that part of the SiC semiconductor substrate 104, e.g. a handle substrate, which is separated from a remaining part of the SiC substrate or from the SiC device layer 110, for example.

The process features illustrated in FIGS. 2A to 2C may be integrated into the method described with reference to FIGS. 1A to 1E, for example.

Figure 2A:
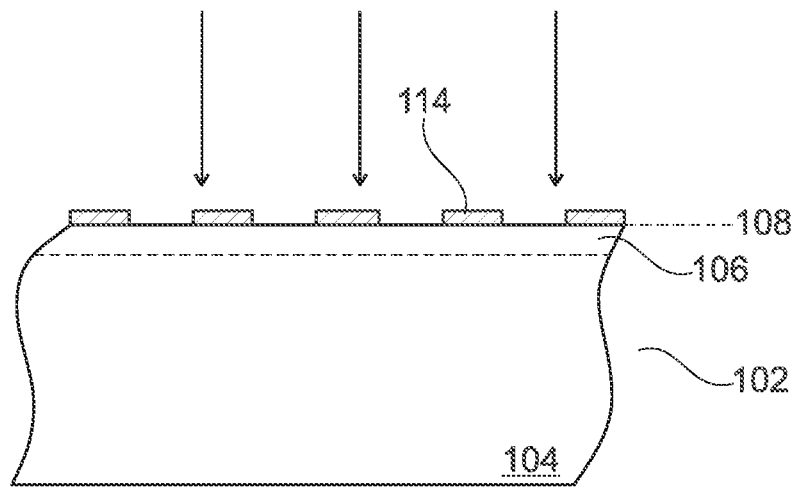
FIGS. 2A to 2C illustrate exemplary process features that may be integrated in the method illustrated in FIGS. 1A to 1E.
Figure 2B:
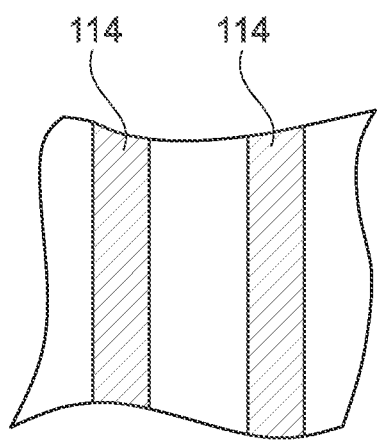
Figure 2C:
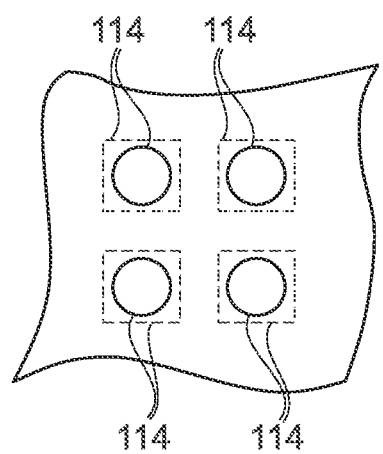

Referring to FIG. 2A, an implantation mask 114 is formed over the first surface 108 of the SiC semiconductor body 102, e.g. one of the substrate surface, the buffer surface or the surface after the drift zone deposition. The implantation mask 114 includes mask openings 116 where ions may enter the semiconductor body 102 without being blocked by the mask during ion implantation. Details described in the example above, e.g. with respect to the implantation mask or the openings, likewise apply to the illustrated examples. Exemplary plan views of the implantation mask 114 are illustrated in FIGS. 2B and 2C. The implantation mask 114 may be stripe-shaped as is schematically illustrated in FIG. 2B. Alternatively or in addition, the implantation mask 114 may include a plurality of mask portions laterally spaced from one another and being arranged in a regular pattern. The mask portions may be circular (exemplified by a solid line), elliptic, polygonal, e.g. square (indicated by a dashed line), for example. Shape and dimensions of the mask pattern may be appropriately chosen for achieving desired crystal quality when forming the SiC device layer by lateral epitaxial overgrowth, for example.

Figure 3A:
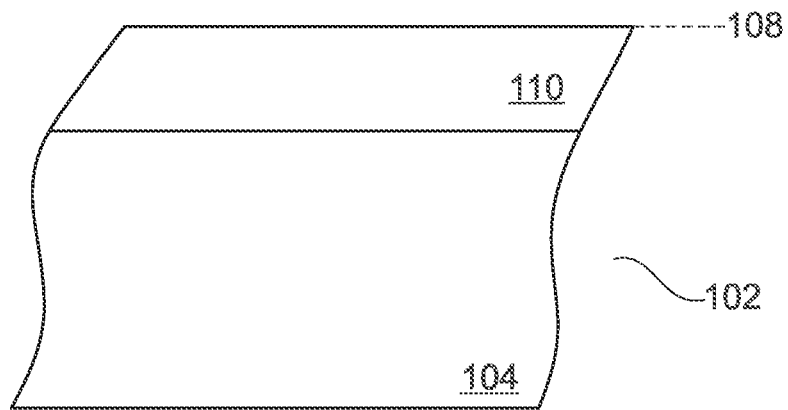
FIGS. 3A to 3B show schematic cross-sectional views for illustrating another method of manufacturing a SiC semiconductor device.
Figure 3B:
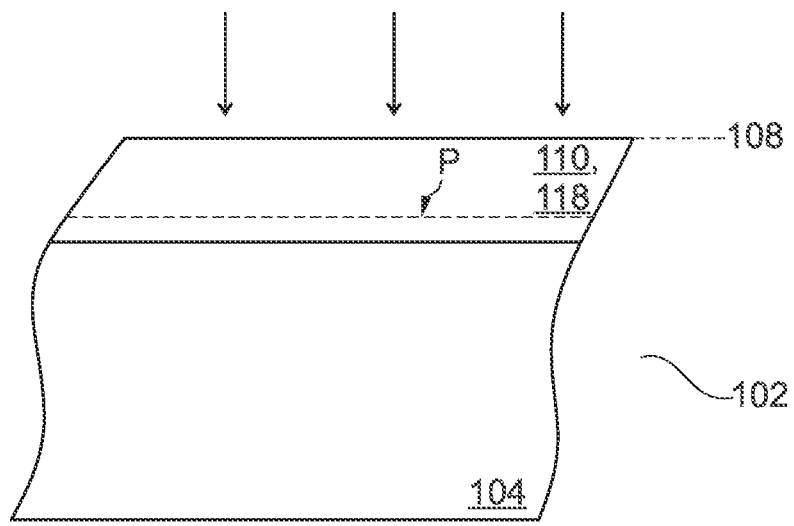

Another example of a method for manufacturing a semiconductor device is illustrated in FIGS. 3A to 3B.

Referring to FIG. 3A, a silicon carbide, SiC, semiconductor body 102 is provided. The SiC semiconductor body 102 includes a SiC semiconductor substrate 104, e.g. a 4H—SiC semiconductor substrate. A SiC device layer 110, which may include a buffer layer between the drift zone and the SiC substrate, is formed over the SiC semiconductor body 102. Details described in the examples above, e.g. with respect to the SiC semiconductor body or the SiC semiconductor substrate or the SiC device layer, likewise apply to the illustrated examples.

Referring to FIG. 3B, ions are introduced into the SiC device layer 110 through a first surface 108 of the SiC device layer 110 by at least one ion implantation process. A predominant part of a vertical extent of a drift zone 118 in the SiC device layer 110 is arranged between an end-of-range peak P of the ions and the first surface 108 of the SiC device layer 110. Details described in the example above, e.g. with respect to the ions introduced into the SiC device layer, likewise apply to the illustrated examples.

The method is continued with formation of semiconductor device elements in or over the SiC device layer as is described with reference to the example of FIG. 1C. Similar to the example illustrated in FIGS. 1D and 1E, a first load electrode, an optional control electrode C and a second load electrode L2 may be formed, for example.

The exemplary methods described above with reference to the figures may be used for manufacturing a semiconductor device including a SiC drift zone 118 over a SiC field stop zone and/or a SiC semiconductor substrate 104. A concentration of $Z_{1/2}$ defects in the SiC drift zone 104 is at least 1 order of magnitude smaller than in the SiC field stop zone and/or the SiC semiconductor substrate 104. The SiC field stop zone may be formed in the buffer layer 106 illustrated in FIGS. 1A to 1E, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a silicon carbide (SiC) drift zone over a SiC field stop zone and/or a SiC semiconductor substrate, wherein a concentration of $Z_{1/2}$ defects in the SiC drift zone is at least one order of magnitude smaller than in the SiC field stop zone and/or the SiC semiconductor substrate.

2. The semiconductor device of claim 1, wherein the SiC drift zone is formed by 4H—SiC.

3. The semiconductor device of claim 1, wherein the concentration of $Z_{1/2}$ defects in the SiC drift zone is at least three orders of magnitude smaller than in the SiC field stop zone and/or the SiC semiconductor substrate.

4. The semiconductor device of claim 1, wherein the SiC semiconductor substrate is a 4H—SiC semiconductor substrate.

5. The semiconductor device of claim 1, wherein the SiC drift zone is a first part of a SiC device layer and the SiC field stop zone is a second part of the SiC device layer.

6. The semiconductor device of claim 5, further comprising semiconductor device elements formed in or over the SiC device layer.

7. The semiconductor device of claim 6, wherein the semiconductor device elements include at least one of device elements of a pn- or pin-diode, a bipolar junction transistor, a field effect transistor, an insulated gate bipolar transistor, and a thyristor.

8. The semiconductor device of claim 5, wherein the SiC device layer comprises an end-of-range peak of ions that form electron and hole recombination sites, and wherein a predominant part of a vertical extent of the drift zone is arranged between the end-of-range peak of the ions and a first surface of the SiC device layer.

9. The semiconductor device of claim 8, wherein the ions include at least one of protons, He-ions, Ar-ions, Si-ions, and C-ions.

10. The semiconductor device of claim 1, wherein the field stop zone is arranged between the drift zone and a rear side contact.

11. The semiconductor device of claim 1, further comprising a SiC buffer layer on the SiC semiconductor substrate.

12. The semiconductor device of claim 11, wherein a thickness of the SiC buffer layer ranges from 0.5 µm to 30 µm.

13. The semiconductor device of claim 11, wherein the SiC drift zone is part of a SiC device layer, and wherein a doping concentration averaged along a vertical extent of the SiC device layer is smaller than a doping concentration averaged along a vertical extent of the SiC buffer layer.

14. The semiconductor device of claim 11, wherein the SiC drift zone is part of a SiC device layer, and wherein a doping concentration along a predominant part of a vertical extent of the SiC buffer layer gradually and/or continuously decreases along a direction from the SiC semiconductor substrate to the SiC device layer.

15. A semiconductor device, comprising:
a silicon carbide (SiC) drift zone over a SiC field stop zone and/or a SiC semiconductor substrate, wherein a concentration of $Z_{1/2}$ defects in a part of the SiC drift zone is at least one order of magnitude smaller than in another part of the drift zone.

16. The semiconductor device of claim 15, wherein the SiC drift zone is formed by 4H—SiC.

17. The semiconductor device of claim 15, wherein the SiC drift zone is part of a SiC device layer, and wherein semiconductor device elements are formed in or over the SiC device layer.

18. The semiconductor device of claim 15, further comprising a SiC buffer layer on the SiC semiconductor substrate.

19. The semiconductor device of claim 18, wherein the SiC drift zone is part of a SiC device layer, and wherein a doping concentration averaged along a vertical extent of the SiC device layer is smaller than a doping concentration averaged along a vertical extent of the SiC buffer layer.

20. The semiconductor device of claim 18, wherein the SiC drift zone is part of a SiC device layer, and wherein a doping concentration along a predominant part of a vertical extent of the SiC buffer layer gradually and/or continuously decreases along a direction from the SiC semiconductor substrate to the SiC device layer.

21. A semiconductor device, comprising:
   a silicon carbide (SiC) device layer over a SiC buffer layer; and
   SiC semiconductor device elements formed in the SiC device layer,
   wherein the SiC buffer layer includes defect sites that promote electron and hole recombination,
   wherein a concentration of $Z_{1/2}$ defects in the SiC device layer is at least one order of magnitude smaller than in the SiC buffer layer.

* * * * *